United States Patent
Steinlage et al.

(10) Patent No.: US 6,335,065 B1
(45) Date of Patent: Jan. 1, 2002

(54) PROCESS FOR SLIP CASTING TEXTURED TUBULAR STRUCTURES

(75) Inventors: Greg A. Steinlage; Kevin P. Trumble; Keith J. Bowman, all of West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 09/438,011

(22) Filed: Nov. 10, 1999

Related U.S. Application Data

(62) Division of application No. 08/338,323, filed on Nov. 14, 1994, now Pat. No. 6,008,163.

(51) Int. Cl.[7] .............................. H01L 39/00; B28B 1/28
(52) U.S. Cl. ...................... 428/34.5; 428/34.6; 505/490; 505/492; 505/501; 505/739; 505/741; 264/86; 264/108; 264/637
(58) Field of Search ............................... 428/34.4, 34.5, 428/34.6; 505/490, 501, 739, 741, 492; 264/86, 108, 637

(56) References Cited

U.S. PATENT DOCUMENTS

| | | | |
|---|---|---|---|
| 2,962,790 A | 12/1960 | Daniel | 25/156 |
| 3,041,699 A | 9/1962 | Daniel | 25/29 |
| 4,937,214 A | 6/1990 | Morita et al. | 501/127 |
| 5,081,072 A | * 1/1992 | Hosokawa et al. | 505/490 |
| 5,371,068 A | * 12/1994 | Preisler et al. | 505/501 |
| 5,409,801 A | * 4/1995 | Baumann et al. | 505/490 |
| 5,443,770 A | 8/1995 | Krstic et al. | 264/60 |
| 5,478,801 A | * 12/1995 | Lang et al. | 505/490 |
| 5,482,919 A | * 1/1996 | Joshi | 505/878 |
| 6,008,163 A | * 12/1999 | Steinlage et al. | 505/490 |

OTHER PUBLICATIONS

Slip casting high–$T_c$ superconducters, Journal of Materials Science Letters, vol. 8, No. 7, 759–761, 1989.
Role of Ag Additions in the Microstructural Development, Strain Tolerance, and Critical Current Density of Ag–Sheathed . . . , Journal Materials Research, vol. 8, No. 10, 2458–2464, Oct. 1993.
Effects of Silver Additions on Resistance to Thermal Shock and Delayed Failure of $YBa_2Cu_3O_{7-\delta}$ Superconductors, Journals of Materials Research, vol. 8, No. 6, 1226–1231, Jun. 1993.
Magnetic Shield of High–$T_c$ Bi–Pb–Sr–Ca–Cu–O Superconductors at 77K for Squid Measurements, IEEE Transactions on Magnetics, vol. 27, No. 2, 2202–2205, Mar. 1991.
New Method for Fabrication of Superconducting Pipes in the Bi–Sr–Ca–Ca–O System, Journal of Materials Research, vol. 8, No. 1, 1–4, Jan. 1993.

* cited by examiner

*Primary Examiner*—Rena L. Dye
(74) *Attorney, Agent, or Firm*—Baker & Daniels

(57) ABSTRACT

A process for centrifugal slip casting a textured hollow tube. A slip made up of a carrier fluid and a suspended powder is introduced into a porous mold which is rotated at a speed sufficient to create a centrifugal force that forces the slip radially outward toward the inner surface of the mold. The suspended powder, which is formed of particles having large dimensional aspect ratios such as particles of superconductive BSCCO, settles in a textured fashion radially outward toward the mold surface. The carrier fluid of the slip passes by capillary action radially outward around the settled particles and into the absorbent mold. A layer of mold release material is preferably centrifugally slip cast to cover the mold inner surface prior to the introduction of the BSCCO slip, and the mold release layer facilitates removal of the BSCCO greenbody from the mold without fracturing.

7 Claims, 5 Drawing Sheets

PROCESS FOR SLIP CASTING TEXTURED TUBULAR STRUCTURES

This is a division of application Ser. No. 08/338,323, filed Nov. 14, 1994 U.S. Pat. No. 6,008,163.

This invention was made with Government support under Grant #DE-FG02-90ER45427 awarded by the Department of Energy. The Government has certain rights in the invention.

BACKGROUND OF THE INVENTION

This invention relates to the production of hollow cylinders or tubes, and, in particular, to producing a textured hollow tube by means of centrifugal slip casting anisometric materials to a preferred orientation against a liquid absorbent mold surface.

Powder processing of components such as tubes is advantageous in many circumstances, including where the melting temperature of the desired production material is sufficiently high that liquid casting and solidification of the entire component is impractical due to restrictions of the mold material or solidification direction or in cases in which phase changes or phase separation occurs on freezing the melt. Powder processing is also advantageous in other microstructural aspects such as grain size control and induced texture.

Current technology for some types of tube production relies on powder particles to be consolidated by means of cold-pressing or hot-pressing, or by traditional slip casting. Most common is cold-pressing or hot-pressing the precursor powder into a cylinder. The center of the cylinder is then removed by a machining process, such as drilling, boring, or grinding. Because many ceramic materials are difficult to machine, the removal of the center of the pressed cylinder can be very difficult and expensive. While it is possible to press a tube without having to remove the center, there is limited preferred orientation induced in this process when the tube wall thickness is small compared to the length of the tube due to die wall friction effects. Cold-pressing of materials relies completely on the rotation and fracturing of powder particles to obtain preferred orientation. Fracturing of the powder can often be detrimental because of the reduction in particle size. The amount of orientation induced by pressing varies with position inside the tube as well, also due to die wall friction effects. With axial pressing, the tube ends would obtain significant orientation with the long dimension of the particles parallel to the pressing surface. At the tube longitudinal center, minimal orientation benefits would be obtained. Consequently, these techniques have limited ability to produce textured tubular components. In other words, tubes and tube-shaped devices or components that can be or are currently made by mechanically consolidating precursor powders to form tubes are typically manufactured without inducing significant orientation to the constituent particles or grains.

Because randomly oriented components do not take advantage of anisotropic material properties, improvements to these tubular components may be made by inducing a preferred orientation of the powder particles within the tube. Many material properties are dependent upon the crystallographic direction orientation of the grains which constitute the bulk material. Aligning these grains in a desired direction takes advantage of the direction dependent properties. Some common direction dependent properties include fracture toughness, yield strength, current carrying capability, and piezoelectric effects. Production of textured tubes has potential advantages in fracture toughness, critical current, elasticity, and other crystal direction related properties of materials. Improving these properties through texturing allows improved efficiency and/or a reduction in the necessary quantity of material required compared to non-textured components.

Another known manner of producing tubes is disclosed in U.S. Pat. No. 2,962,790, which involves centrifugally slip-casting a ceramic material. While teaching a method to provide a tube shaped product, this reference fails to expressly provide for higher levels of texturing and density which are desirable from the standpoint of improving the properties of tubes formed from anisometric materials having anisotropic properties. In another known process disclosed in U.S. Pat. No. 4,937,214, centrifugal forces are utilized to properly orient the grains of ceramic materials. However, because the cast material does not employ a slip carrier fluid which during casting passes through settled particles and into the mold, texture and density of the cast product are not further increased.

One beneficial application of tubular components involves superconductors. Tubular superconducting devices may be used to protect sensitive electronic equipment against stray electromagnetic fields. Tubular superconducting devices are also used to conduct electrical current more efficiently than metal wires, as such superconducting tubes, when cooled to very low temperatures by fluids flowing therein, have minimal to zero resistance. One relatively new type of superconducting material is known as BSCCO, which advantageously functions at temperatures higher than many longer known superconductors. As BSCCO can be cooled to an operational temperature with liquid nitrogen rather than the significantly more expensive and less available colder liquid helium required for many longer known superconductors, BSCCO tubes may be cheaper to operate than other superconducting tubes. However, because BSCCO is composed of anisometric particles having anisotropic properties, texturing of these tubes is important to produce a tube which functions efficiently.

Thus, it is desirable to provide a process for producing tubes which obtains a highly textured and densified tube.

SUMMARY OF THE INVENTION

Centrifugal slip casting utilizes component production and powder particle orientation methods inherent to conventional slip casting, but also involves additional g-loading to produce higher green densities and strengths and improves texturing of the powder particles. Consequently, tubes produced by centrifugal slip casting from anisometric particles having anisotropic properties may be advantageously provided with superior overall properties. The present invention allows superconducting BSCCO material to be formed into a useful tubular shape in a highly textured arrangement, and this texturing increases the efficiency and usefulness of the BSCCO tubes.

In one form thereof, the present invention provides a process for centrifugal slip casting a hollow tube and involves the steps of rotating a hollow tube mold about its axis at a speed sufficient to produce a centrifugal force sufficient to force an introduced slip radially outward toward the inner surface of the mold; introducing a slip into the rotating mold such that the centrifugal force results in the slip migrating radially outward toward the mold inner surface, wherein the slip comprises a carrier fluid and a suspended powder, wherein the suspended powder comprises powder particles having large dimensional aspect ratios; continuing the rotation of the mold after slip introduction at a speed sufficient to maintain the slip outward toward the mold inner surface such that the powder particles suspended within the carrier fluid settle in a textured fashion toward the mold surface and such that the carrier fluid passes by capillary action radially outward around the settled particles, through the inner surface, and into the mold, whereby a cast tubular greenbody is formed of settled powder particles; stopping rotation of the mold; and removing the greenbody from the mold.

In another form thereof, the present invention provides a process for forming a hollow tube comprising the steps of rotating a hollow tube mold about its axis at a speed sufficient to produce a centrifugal force sufficient to force an introduced slip radially outward toward the inner surface of the mold; centrifugally slip casting a first slip within the rotating mold such that the first slip casting forms a first settled powder layer against the mold inner surface, wherein the first slip comprises a suspended powder including a mold release material; centrifugally slip casting a second slip within the rotating mold such that the second slip casting forms a second settled powder layer disposed radially inwardly of the first layer; stopping rotation of the mold; and removing the casting comprised of the first layer and the second layer from the mold.

In still another form thereof, the present invention provides a highly textured hollow tube prepared by the process of rotating an absorbent hollow tube mold about its axis at a speed sufficient to produce a centrifugal force sufficient to force an introduced slip radially outward toward the inner surface of the mold; centrifugally casting a slip within the rotating mold, wherein the slip comprises a carrier fluid and a suspended powder, wherein substantially all of the suspended powder comprises powder particles having large dimensional aspect ratios, wherein during centrifugal casting the powder particles settle in a textured arrangement toward the mold inner surface, wherein during centrifugal casting and after powder particle settlement the carrier fluid further textures the settled particles by passing by capillary action radially outward around the settled particles, through the inner surface, and into the mold to be absorbed thereby, whereby a cast tubular greenbody is formed of settled powder particles; stopping rotation of the mold; and removing the greenbody from the mold.

One advantage of the present invention is that in comparison to traditional slip casting and mechanical consolidation methods, higher greenbody densities and higher textures can be obtained due to the high degree of orientation of particles.

Another advantage of the present invention is that the use of a casting release layer allows the casting to be readily removed from the mold prior to the high temperature sintering required for many cast metals and ceramics, thereby preventing possible melting of the mold or contamination of the casting by diffusion of materials to and from the mold.

Another advantage of the present invention is that melting or partial melting of the cast material to achieve a high degree of texturing or bulk density in the product is not required, thereby eliminating possible phase changes possible with melt or partial melt processing.

Another advantage of the present invention is that a BSCCO tube can be made wherein the BSCCO particles are highly oriented, thereby resulting in a BSCCO tube with properties superior to BSCCO tubes formed using more conventional techniques.

Another advantage of the present invention is that the casting of laminates allows incorporation of multiple layers into the cast tube for enhanced mechanical properties of the tube Still another advantage of the present invention is that very thin layers of material can be incorporated into the laminate casting.

Still another advantage of the present invention is that densification can be engineered to occur mostly in the through thickness direction with highly anisometric particles, which decreases the stress imposed on the casting during sintering and thus improves the mechanical integrity of the casting.

Still another advantage of the present invention is that the sintering rate of the casting can be controlled by varying the constituent powder particle size distributions.

BRIEF DESCRIPTION OF THE DRAWINGS

The above-mentioned and other features and advantages of this invention, and the manner of attaining them, will become more apparent and the invention will be better understood by reference to the following description of the invention taken in conjunction with the accompanying drawings, wherein.

Corresponding reference characters indicate corresponding parts throughout the several views. Although the drawings represent the invention, the drawings are not necessarily to scale and certain features may be exaggerated in order to better illustrate and explain the present invention.

DESCRIPTION OF THE PREFERRED EMBODIMENTS

The embodiments disclosed below are not intended to be exhaustive or limit the invention to the precise forms disclosed in the following detailed description. Rather, the embodiments are chosen and described so that others skilled in the art may utilize the teachings of the present invention.

In general terms, during centrifugal slip casting operations a cylindrical porous mold is rotated about its axis to provide centrifugal force. The centrifugal force causes the slip or slurry introduced into the mold cavity to coat the interior surface of the mold, resulting in the particles suspended within the slip settling against the mold and the carrier fluid of the slip eventually passing by capillary fluid flow around the settled particles and into the mold where the fluid is absorbed. The mold may be rotated such that its axis is positioned either horizontally or vertically. A vertical rotation axis does not prevent the tube wall thickness at the bottom of the tube from being thicker than the tube wall thickness near the top of the tube. When rotated horizontally, the centrifugal force must be at least 1 g, or equal to the gravitational force, in order for the material to remain in contact with the mold throughout the rotation. When cast horizontally, the tube wall thickness will be the same along the entire tube length due to the absence of gravitational effects in this direction. Additional background information on centrifugal slip casting processes can be found in U.S. Pat. Nos. 2,962,790 and 3,041,699, the teachings of which are expressly incorporated herein by reference.

Figure 1:
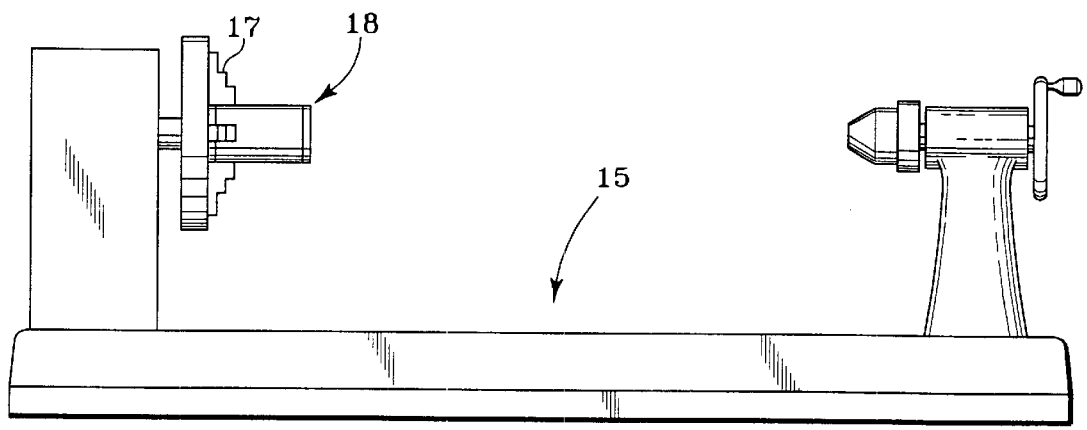
FIG. 1 is a diagrammatic front view of a centrifugal slip casting apparatus used in the process of the present invention.
Figure 2:
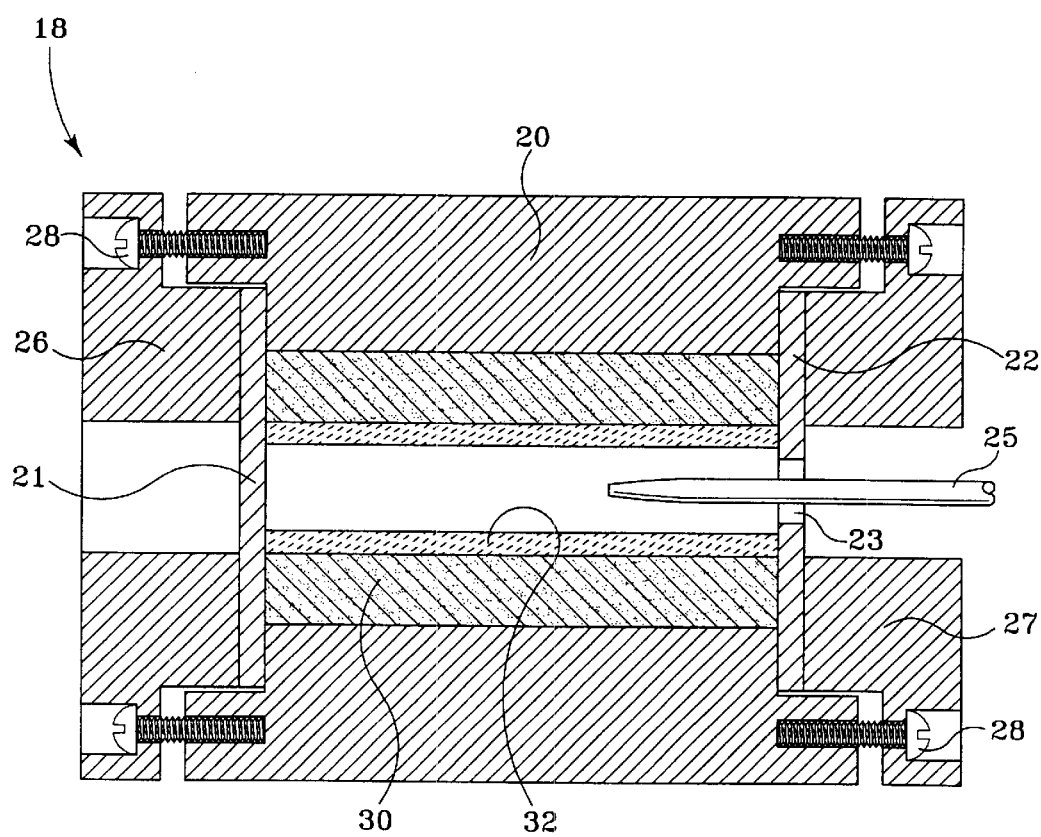
FIG. 2 is a longitudinal cross-sectional front view of the mold assembly, wherein a cast cylindrical greenbody is shown within the mold, and wherein a syringe used to inject the slip into the mold is abstractly represented.

Referring now to FIGS. 1 and 2, one embodiment of a centrifugal slip casting apparatus and mold assembly suitable for use with the present invention are shown. A conventional lathe, generally designated 15, is provided with a four jaw chuck 17, which tightens around a mold assembly, generally designated 18. Lathe 15 achieves the necessary rotation or spinning of mold assembly 18 around a horizontal axis to realize centrifugal casting within assembly 18. The known overall structure and power source of lathe 15 is not material to the present invention and not further described herein.

As best shown in FIG. 2, wherein mold assembly 18 is shown in longitudinal cross-section removed from lathe 15, mold assembly 18 includes a porous mold 30 in which a slip is centrifugally cast. Mold 30 is formed from plaster of paris in a generally cylindrical, tubular shape such that the cast greenbody, abstractly represented at 32, will be tubular shaped after centrifugal casting. Porous mold 30 is axially encased in a cylindrical sheath 20 made of a rigid material such as stainless steel. Mold 30 is static cast in the desired shape to fit within sheath 20, but could also be centrifugally cast within sheath 20. As described more fully below, the porous construction of plaster mold 30 allows for penetration by the slip carrier fluid and the absorption of this fluid. Substances other than plaster which are capable of permeation by and absorption of the carrier fluid in the slip may also be fashioned into the mold. In addition, mold 30 may be formed by composites such as an outer lining of an absorbent material, for example a standard foam composition sometimes used in slip casting, with a carrier liquid permeable inner lining, for example filter paper. Tube components having other than cylindrical exteriors and with various lengths and radii are also within the scope of the invention and may be formed by modifying plaster mold 30 accordingly.

Sheath 20 allows porous mold 30 to be properly aligned and mounted to chuck 17 without deformation or damage possibly resulting if chuck 17 were to otherwise directly grip mold 30. Sheath 20 also prevents exterior surface portions of mold 30 from separating from and flying off the body of the mold during the high speed rotation experienced during casting.

Still referencing FIG. 2, opposing longitudinal ends of mold 30 are sealed with transparent TEFLON™ sheets 21, 22 that allow observation of the slip during casting. A small hole 23 in sheet 22 permits the insertion into and withdrawal from the mold cavity of an apparatus, diagrammatically represented at 25, through which the slip or slurry being centrifugally cast may be injected. TEFLON™ sheets 21, 22 are held in place at the mold ends by opposite end caps 26, 27 secured to sheath 20 with suitable abstractly shown fasteners 28. The entire mold assembly 18 is rotated to apply the outward acceleration required to centrifugally cast cylindrical greenbody 32.

Figure 3:
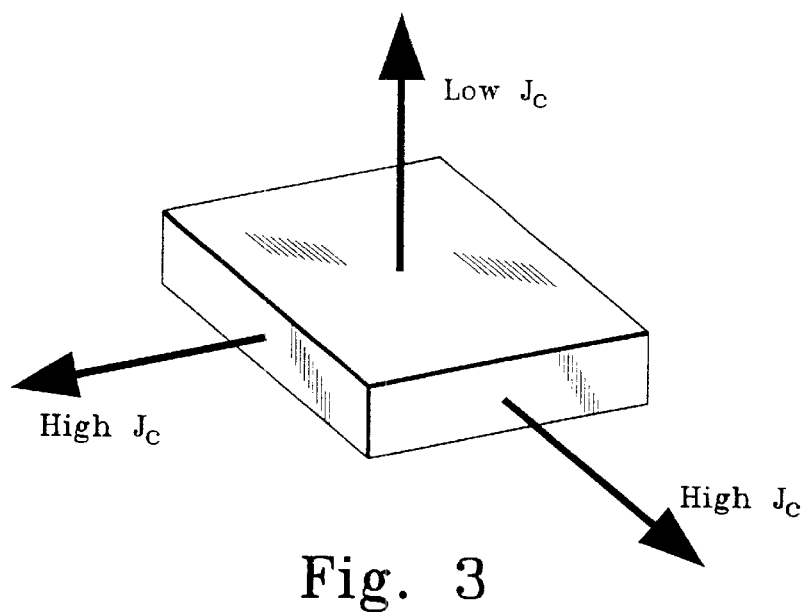
FIG. 3 is a perspective representation of an anisometric, platelet particle showing anisotropic behavior of critical current density, $J_c$.

Preparation of the slip to be centrifugally cast involves providing a carrier fluid and a quantity of powder particles to be suspended within the carrier fluid. Although useful to centrifugally cast slips of various compositions of fluid medium and powders particles, the inventive process has been found to be of significant advantage in texturing anisometric powder particles, especially particles having anisotropic properties. This type of anisometric particle is abstractly represented in FIG. 3, wherein an anisotropic behavior of critical current density, $J_c$, is shown. The texturing within a centrifugally cast tube of these types of particles produces a tube having superior overall properties.

The preferred materials for being formed into tubes by the inventive process are constituted of anisometric particles having a plate-like particle morphology. Materials made of particles with an anisometric rod-like morphology may also be employed. Both of these types of particle morphologies have high dimensional aspect ratios that yield orientation benefits or texturing during centrifugal casting. Materials which have been advantageously utilized with the present invention include bismuth titanate ($Bi_4Ti_3O_{12}$) and a high-temperature oxide superconductor system, such as BSCCO-2223 formed from $(Bi,Pb)_2Sr_2Ca_2Cu_3O_x$ particles.

Samples of bismuth titanate and BSCCO are made up of the agglomeration of plate-like or platelet particles of ceramic powder with long dimension to thickness aspect ratios of 10 to 100. The average long dimension of the bismuth titanate and BSCCO powder particles is 5 and 10 microns, respectively. Although any metal or ceramic powders having particles with large aspect ratios may be used, the bismuth titanate and BSCCO material particles possess highly anisotropic ferroelectric and superconducting properties, respectively, and therefore the texturing of these materials achieved by the centrifugal slip casting increases the magnitude of these properties in the cast tube.

The present invention will be more fully explained with reference to centrifugally slip casting a tube made from a BSCCO ceramic. A sample of BSCCO ceramic material is first comminuted to a fine powder through any well known process, including the use of agate mortar and pestling, ball milling, or vibration milling. To be in a form most conducive to obtaining optimum texturing within the cast greenbody, the fine powder is preferably comminuted to a condition wherein substantially all of the agglomeration of the ceramic material is eliminated. The resulting powder particles are essentially individual anisometric BSCCO platelets which may be either a single crystal or polycrystalline in form. As used herein, powder particles refers to the platelet shaped portion of the ceramic material which remains after elimination of agglomeration, and is also expressly intended to encompass the anisometric rod-shaped morphology referenced above and present in other materials after elimination of agglomeration. While a piece of powder intended for introduction into the slip could be an agglomeration of multiple platelets configured so as to not adversely effect texturing, for example two platelets similarly aligned and stacked together, agglomeration of the powder particles is preferably minimized during preparation of the slip powder to ensure maximum texturing.

A carrier fluid for the slip is provided in which the powder particles are suspended. A fluid which does not chemically react with the BSCCO powder particles or cause the particles to agglomerate may be used as the carrier fluid. A fluid with high vapor pressure is advantageous because of its ability to evaporate quickly, which allows the fluid to be readily and completely removed from the greenbody after casting. Hexane is an appropriate carrier fluid for the BSCCO powder due to its high vapor pressure at low-temperatures and its chemical compatibility with BSCCO. Hexane is also appropriate for use as the carrier fluid with bismuth titanate. Other liquid mediums, such as water, alcohol, or heptane, could be used depending on the compatibility with the powder particles being cast.

The BSCCO powder is added to the hexane carrier fluid until a solid-to-liquid volume ratio of ≈0.15 is obtained. Other solid-to-liquid ratios could be employed within the scope of the invention such that slurry fluidity and liquid phase removal could be accomplished. However, higher ratios increase the likelihood of powder particles contacting each other during the settling which occurs during casting and this contact may hinder texturing.

To ensure that the BSCCO powder particles do not agglomerate in the slip due to the surface forces of the particles, a commercial dispersant is preferably added to the slip. A suitable dispersant available from ICI Specialty Chemicals of Los Angeles, Calif. is known as KD3. Depending on the slip characteristics, a dispersant is not always necessary. For example, a dispersant is not necessary if the powder particles have inherent repelling surface forces or are provided with repelling surface forces. Although the addition of a dispersant may aid in deflocculating and preventing agglomeration of powder particles, the dispersant is typically left behind in the greenbody when the carrier fluid is absorbed into the mold during centrifugal casting. For this reason, the above polymeric dispersant was chosen as it may be removed from the casting by heat treatment at 300° C. for a short duration without affecting the properties of the BSCCO casting.

Other additives known in the art may also be incorporated into the slip as in traditional slip casting. For example, plasticizers and binders may be uniformly distributed in the slip to provide the cast greenbody with more flexibility to allow easier mold removal. While these additives may also remain in the greenbody after removal of the carrier fluid, they may be removed by special removal processes, such as heating or the use of solvents, which are known in the art.

A slip composition which has been found suitable for the production of BSCCO-2223 ceramic tubes is comprised of 54% by weight BSCCO powder, 44% by weight hexane, and 2% by weight dispersant. After this slip composition has been mixed, the slip is thoroughly ultrasonicated to further reduce agglomeration of the powder particles suspended within the slip.

After the above preparation, the slip is injected into the rotating mold assembly 18, which is rotated at a speed to achieve a centrifugal force of at least 1 g throughout the slip. Higher rotational speeds achieving higher g forces can be used to produce increased particle orientation, and a force of 16.6 g's at the mold wall has been found to provide beneficial alignment. The Reynolds number for the 16.6 g's centrifugal casting is less than 10, with this number being based on the long dimension of the platelets. Centrifugal forces of 2 g's and 25 g's have also been used to produce beneficial alignment. For the centrifugal casting process employed, the Reynolds number is preferably less than 100 and more preferably less than 10. Casting procedures with Reynolds numbers greater than 100 can produce tumbling of the platelets during casting, which could decrease texture. The slip is injected into rotating mold 30 in such a manner as to evenly coat the inside of the mold with the slip. For the syringe 25 abstractly shown in FIG. 2, the slip is introduced along the length of mold 30 by longitudinally moving syringe 25 back and forth during injection. Other known methods and apparatus for distributing the slip evenly within mold 30 may also be employed within the scope of the invention.

Figure 4:
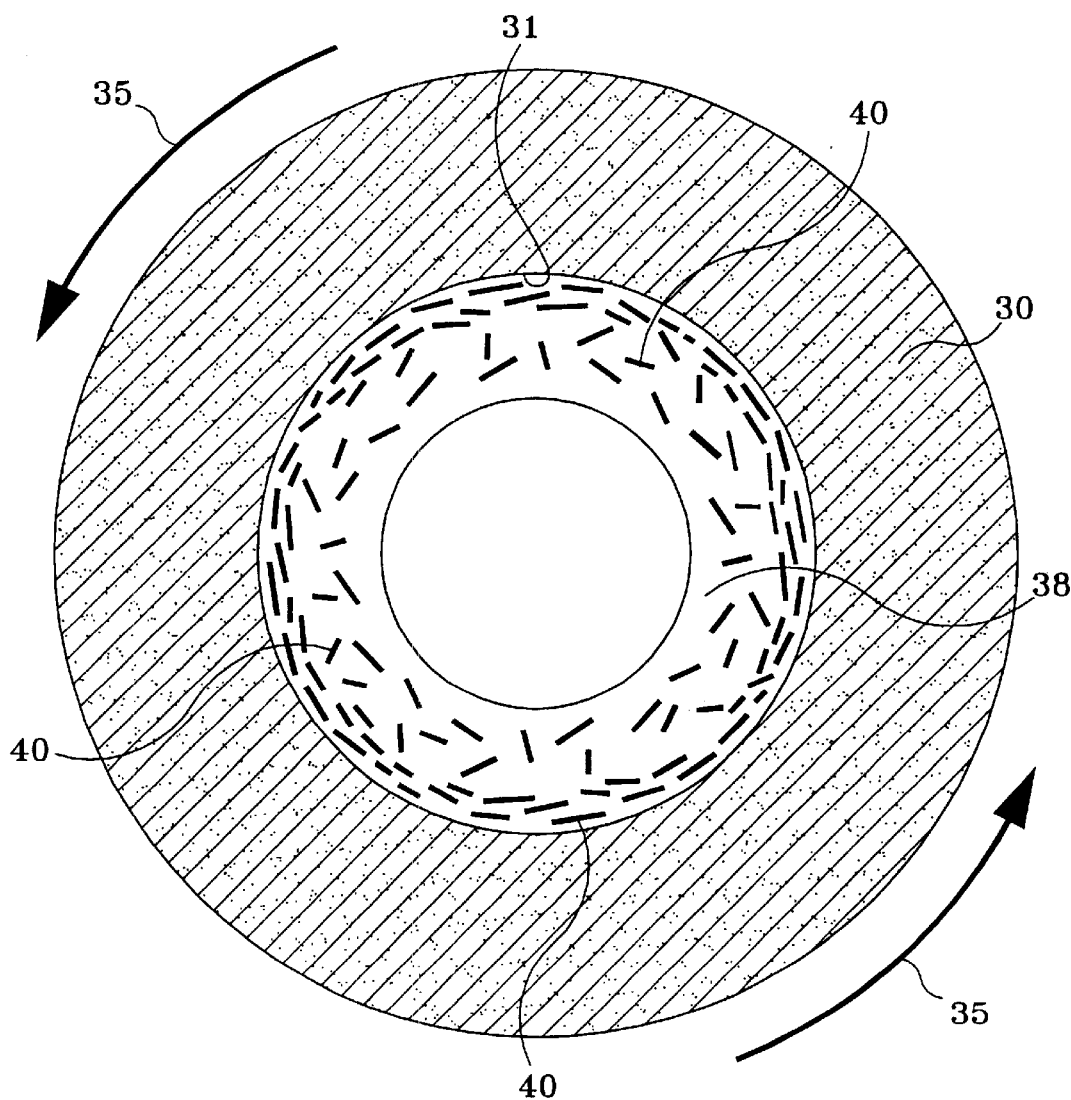
FIG. 4 shows a diagrammatic cross sectional view of a mold with an injected slip during centrifugal slip casting, wherein the anisometric powder particles of the slip are settling in a textured fashion against the interior surface of the mold.

Referring now to FIG. 4, when initially introduced into mold 30 rotating in the direction of arrows 35, the slip is urged radially outward by centrifugal force. As the BSCCO powder particles 40 are more dense than the hexane carrier fluid 38, particles 40 settle outward at a faster rate than fluid 38. As the large aspect ratio particles 40 settle in fluid 38, the particles 40 naturally align themselves so that the longest dimension of each of the platelet particles is perpendicular to the settling direction, resulting in a preferential orientation of the particles 40.

Figure 5:
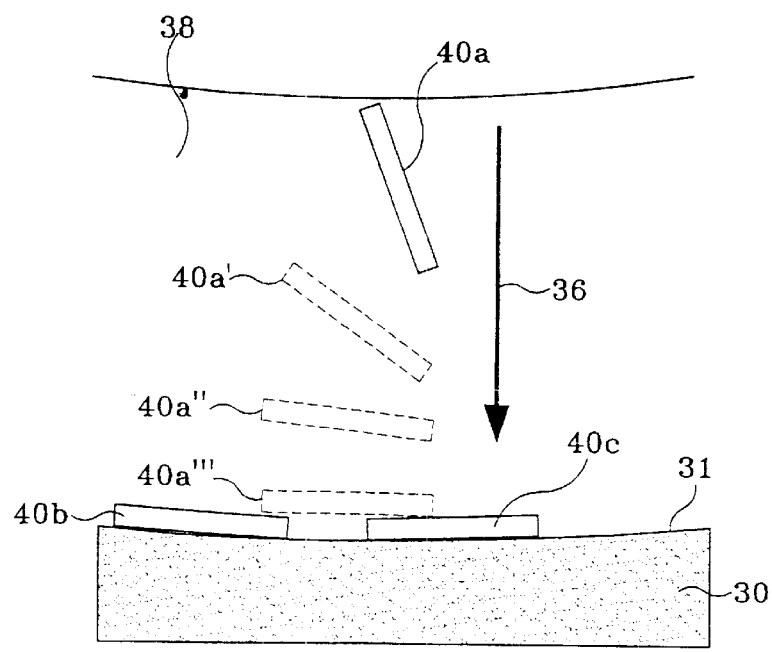
FIG. 5 is a diagrammatic cross-sectional view of a portion of the mold and the injected slip of FIG. 4, wherein the mechanism by which anisometric powder particles settle in an oriented manner against the porous surface of the mold is illustrated.
Figure 6:
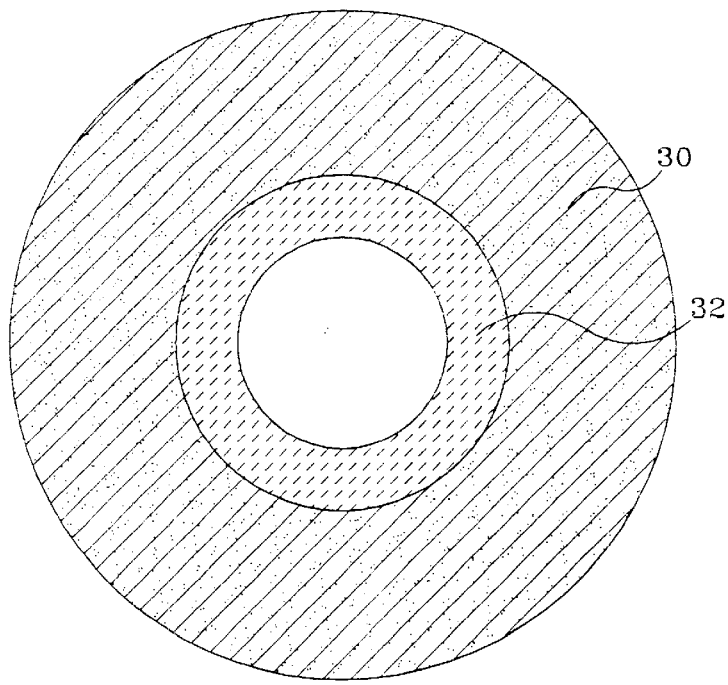
FIG. 6 is a diagrammatic cross-sectional view of a single layer tubular greenbody cast within the porous mold.

In particular, as represented in FIG. 5 wherein a portion of mold 30 and the slip are shown during rotation, powder particle 40a is centrifugally forced radially outward by the centrifugal acceleration represented by arrow 36. Particle 40a rotates through orientations shown in dashed lines as 40a' and 40a" to align so that its longest dimension is perpendicular to the settling direction. As represented in dashed lines at 40a'", powder particle 40a is centrifugally forced to finally rest against the surface which it contacts, namely other powder particles 40b, 40c that have previously settled from carrier fluid 38 against the inner radial surface 31 of mold 30. The impingement and additional weight of newly settled platelets or particles 40a which are similarly aligned push against already settled particles 40b, 40c, improving the alignment and increasing the subsequent density of the cast greenbody 32. As mold rotation continues, the remainder of the powder particles 40 settle and the carrier fluid 38 migrates radially outward due to the centrifugal force. During this migration, carrier fluid 38 passes by capillary fluid flow around settled powder particles 40 and into the fluid permeable mold 30 where fluid 38 is absorbed. This fluid motion through the pores left between the particles, such as 40b and 40c, may further increase alignment and density of the greenbody 32. After the hexane 38 is absorbed by mold 30, the casting will appear as shown in FIG. 6, wherein the centrifugally cast greenbody 32 or casting is homogeneously formed in a tubular shape of the now textured powder particles.

As alluded to above, the powder particles 40 within the slip ay include very small powder particles, and some of these small articles may settle into pores or surface imperfections of the inner surface 31 of mold 30 during centrifugal casting. When this occurs, the interface between mold 30 and greenbody 32 becomes less distinct, which in turn may lead to fracturing of casting 32 during its eventual removal from mold 30. To eliminate the difficulty of releasing the BSCCO greenbody 32 from the porous plaster mold 30, a porous mold release layer is preferably centrifugally slip cast within mold 30 prior to casting of the BSCCO slip. This mold release layer is required to be porous such that the carrier fluid of the subsequently cast BSCC0 slip can pass through the mold release layer so as to penetrate and be absorbed by the porous mold 30.

A suitable mold release layer is comprised of silver powder of an average size of approximately 5 microns. A suitable slip composition for the mold release layer has been found to be made of 57% by weight silver powder, 38% by weight hexane, and 5% by weight dispersant. The silver powder slip is centrifugally slip cast against the plaster mold inner surface 31 in the manner described above with reference to the BSCCO powder. Preferably after the silver powder casting has dried, i.e. the slip carrier fluid has been removed from the casting by absorption into the mold 30 and/or evaporation, the BSCCO slip described above may be cast as a layer 46 directly on top of the silver layer 45 (See FIG. 7) which lines the interior of mold 30. The silver layer 45 prevents the BSCCO particles from penetrating the pores of mold 30 which would make casting release difficult. Prior to the introduction of the BSCCO slip, the silver layer 45 could also be partially sintered by heating the layer for times and temperatures known in the art. The outer cladding of silver on the BSCCO casting not only serves mold release purposes but also improves the mechanical integrity of the tubular component.

Silver is desirable as a mold release as it sinters at low temperatures, allowing the layer 45 against the mold surface to sinter at a temperature which is not detrimental to plaster mold 30. Although silver is described herein, other materials which do not react with the cast greenbody may be employed as the mold release layer. As abstractly shown in FIG. 7, after the mold release layer 45 is cast, additional powder layers 46, 47 may be centrifugally cast in the manner described above without making difficult the release of the greenbody from the porous mold 30. For example, layer 46 as described above may be made from a BSCCO slip and layer 47 may be an additional silver layer. These layers may alternatively be formed of slips of different compositions which produce layers in the greenbody having desirable properties for the tube. For example, different layers may be provided which have desirable electrical, optical, or corrosion properties, or that prevent reaction between layers.

Rather than centrifugally casting a material which forms another layer on the previously cast layer, it may be desireable to centrifugally cast a material which infiltrates the pores within a BSCCO greenbody or other previous layers. This centrifugally cast material can be an additional slip of colloidal silver with smaller particle size such that the particles fit within the pores. Alternatively, the centrifugally cast material can be a liquid metal such as lead which enters and fills the greenbody pores. This liquid metal could also be static cast. This infiltration of the pores of the previously cast greenbody decreases porosity therein, and thereby increases the current carrying ability of the greenbody as well as the mechanical integrity of the greenbody, such as fracture toughness or ductility.

Figure 7:
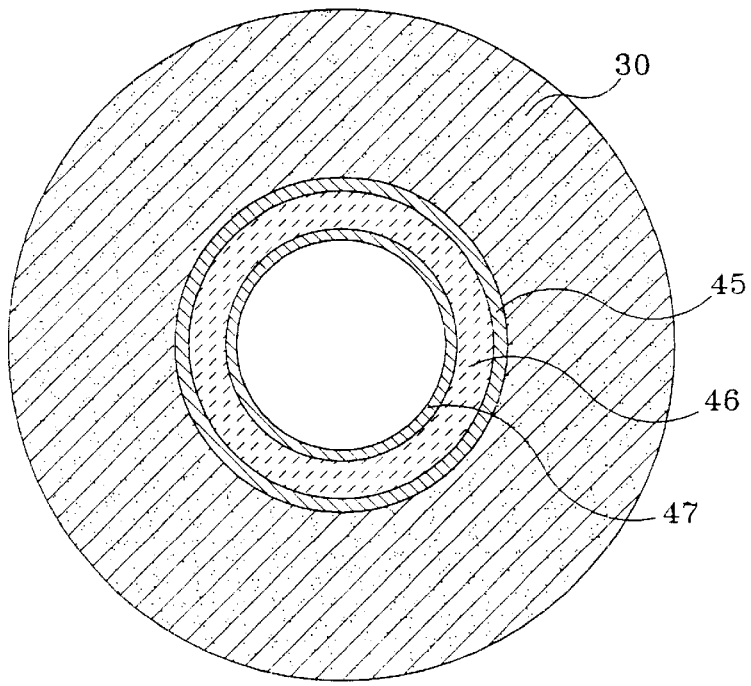
FIG. 7 is a diagrammatic cross-sectional view of a mold with a multilayer tubular greenbody which may alternatively be cast within the scope of the present invention.

After the greenbody has been cast, the mold and casting are dried using conventional techniques such that the hexane carrier fluid is evaporated. This process occurs for both greenbodies of a single layer as shown in FIG. 6 or of multiple layers as shown in FIG. 7. During drying, the casting may necessitate rotating to keep the tube layer or layers from sagging. Drying the mold and casting prevents the bubbling of the casting caused by vapor created from boiling fluids. Drying may also be necessary to prevent combustion of any flammable fluids provided in the original slip or slips.

After drying of the mold and casting, the removal of the centrifugally cast greenbody from the plaster mold 30 may be performed. For the greenbody formed of a single layer of BSCCO as shown in FIG. 6, the greenbody may be removed directly from the mold, but some fracturing of the greenbody exterior may possibly occur.

For the greenbody of FIG. 7 employing a mold release layer 45, the dried mold and casting are heated to sinter silver layer 45 to allow the entire greenbody to be removed from plaster mold 30 without fracturing. During the sintering process, the horizontally disposed tube may be rotated within a furnace to keep the tube from sagging or slumping. Additives to the powder slurry such as the dispersant and any plasticizers or other additives may be burned off in this stage. All of the various layers of the casting may be sintered in this treatment if their compositions sinter below the maximum temperature which plaster mold 30 can withstand.

After sintering, the casting includes a sintered silver layer against mold surface 31 that is much less susceptible to fracture than a non sintered BSCCO powder layer. Due to sintering, the diameter of the multilayered greenbody normally decreases and allows easy separation from mold 30. The greenbody is then easily removed from the mold by sliding out the end or cutting the mold away from the centrifugally cast greenbody.

Any heat treatments that could not be completed with plaster mold 30 attached because of the limitation in maximum temperature of the plaster may then be conducted. For example, using methods well known in the art, the BSCCO layer can be sintered by heating for a period of time dependent on the properties desired in the finished tube. Once the casting is released from the mold, any further processing may be conducted without any limitations imposed by the mold material.

Figure 8:
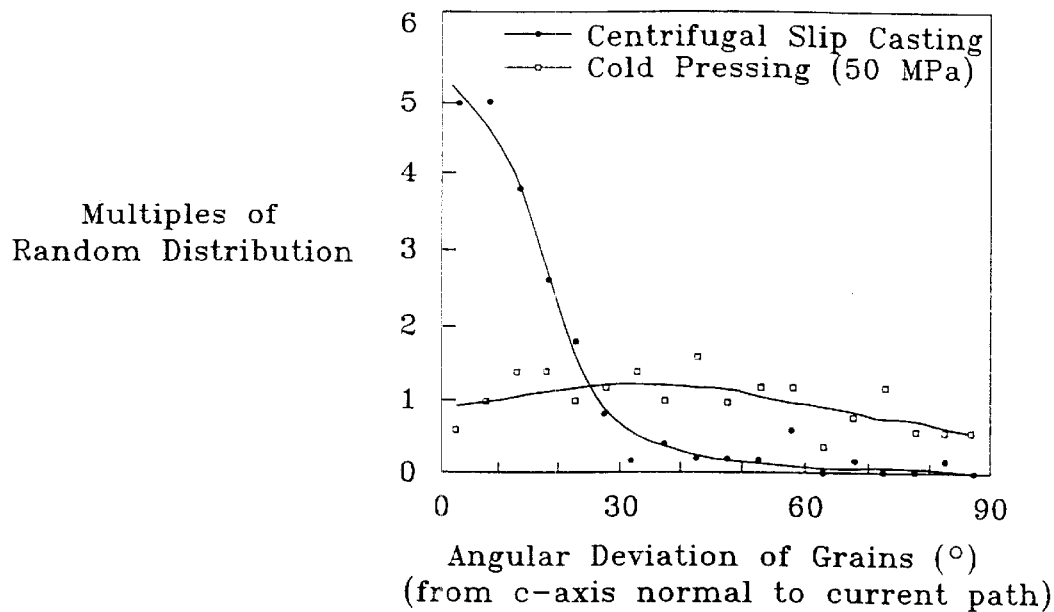
FIG. 8 is a plot quantifying the degree of orientation of a centrifugally slip cast BSCCO-2223 sample compared to a cold-pressed BSCCO-2223 sample.

To evaluate the improved texturing and densification effected by the inventive process, a fractured portion of the centrifugally slip cast tube which was cast as a single layer of BSCCO as shown in FIG. 6 was compared to a BSCCO billet, formed of similar powder particles with the same level of comminution, that was cold-pressed under 50 MPa for 5 minutes and fired or heat treated identical to the cast tube. The bulk densities of the centrifugally slip cast tube and cold-pressed billet were measured to be approximately 71% and 58% of true density, respectively. The higher bulk density in the centrifugally slip cast tube is attributed to increased grain alignment produced by the inventive casting process. The data shown in FIG. 8 indicates that the cast tube, which is centrifugally cast with a force of 16.6 g's at the mold wall, is five times more oriented than the nearly randomly oriented cold-pressed billet, and describes the distribution of grain tilt angles from tube tangency in the slip cast tube and from the compaction plane in the cold-pressed billet.

Figure 9:
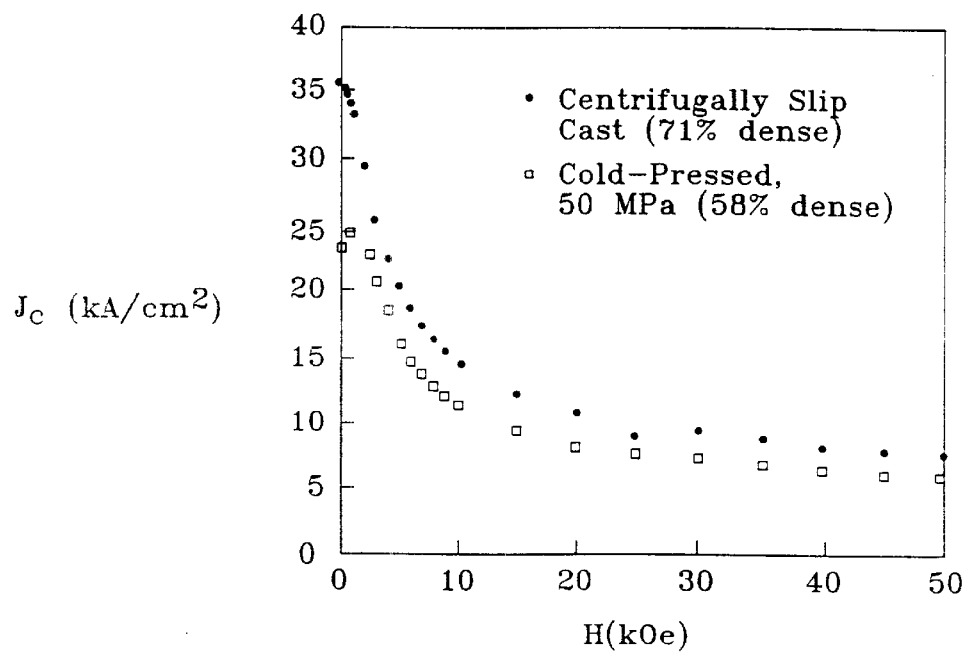
FIG. 9 is a plot of critical current density, Jc, for the centrifugally slip cast and cold-pressed BSCCO-2223 samples.

The field dependence of the critical current density $J_c(H)$ at T=5 K was determined for samples of the centrifugally slip cast tube and the cold pressed billet. The superconducting transition temperatures were identical for both samples. The macroscopic dimension (2.5 mm) of the square samples from the tube and the billet that were perpendicular to the applied field was used to determine the $J_c(H)$ shown in FIG. 9. A less conservative Jc determined on the basis of grain size would be greater by over two orders of magnitude. FIG. 9 shows that $J_c(H)$ for the centrifugally slip cast tube is approximately 30% higher than for the cold-pressed billet due to the increase in preferred orientation and improved, higher density in the centrifugally slip cast sample.

A variety of other slip compositions can be centrifugally cast according to the teachings of the present invention. For example, a slip composition which has been found suitable for the production of $Bi_4Ti_3O_{12}$ ceramic tubes is comprised of 54% by weight $Bi_4Ti_3O_{12}$ powder, 44% by weight hexane, and 2% by weight dispersant. In addition, the powders suspended within the carrier fluid need not be homogeneous in composition and/or in morphology. For example, a slip having two or more compositions of powder particles can be centrifugally cast to create a functionally gradient layer. Such a layer, due to its blending of the interface between different compositions of powder particles, decreases the likelihood of thermal stress induced cracking which may occur with distinct interfaces due to varying expansivities of adjacent layers. Multi-phase layers may also be created.

While this invention has been described with preferred processes, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A highly textured hollow tube prepared by the process of:
   providing an absorbent hollow mold rotatable about its axis, said mold comprising a porous inner surface;
   rotating said mold about its axis at a speed sufficient to produce a centrifugal force sufficient to force an introduced slip radially outward toward said inner surface of said mold;
   centrifugally casting a slip within said rotating mold, wherein said slip comprises a carrier fluid and a suspended powder, wherein substantially all of said suspended powder comprises powder particles having large dimensional aspect ratios, wherein during centrifugal casting said powder particles settle in a textured arrangement toward said mold inner surface with the long dimensions of said particles aligned substantially along an axis, wherein during centrifugal casting and after powder particle settlement said carrier fluid further textures said settled particles by passing by capillary action radially outward around said settled particles, through said inner surface, and into said mold to be absorbed thereby, whereby a cast tubular greenbody is formed of settled powder particles;
   stopping rotation of said mold; and
   removing said greenbody from said mold.

2. The highly textured hollow tube of claim 1 wherein said suspended powder particles comprise BSCCO.

3. The highly textured hollow tube of claim 1 wherein said suspended powder particles comprise a plate morphology.

4. The highly textured hollow tube of claim 1 wherein the process further comprises the step of centrifugally slip casting a mold release layer against said mold inner surface prior to the centrifugal casting of the slip having suspended powder particles with large dimensional aspect ratios.

5. The highly textured hollow tube of claim 4 wherein the mold release layer comprises silver.

6. The highly textured hollow tube of claim 1 wherein the process further comprises the step of centrifugally slip casting at least one additional settled powder layer after casting the slip having suspended powder particles with large dimensional aspect ratios.

7. A highly textured tube prepared by the process of:
   providing an absorbent hollow mold rotatable about its axis, said mold comprising a porous inner surface;
   rotating said mold about its axis at a speed sufficient to produce a centrifugal force sufficient to force an introduced slip radially outward toward said inner surface of said mold;
   centrifugally casting a slip within said rotating mold, wherein said slip comprises a carrier fluid and a suspended powder, wherein substantially all of said suspended powder comprises powder particles having large dimensional aspect ratios, wherein during centrifugal casting said powder particles settle in a textured arrangement toward said mold inner surface, wherein during centrifugal casting and after powder particle settlement said carrier fluid further textures said settled particles by passing by capillary action radially outward around said settled particles, through said inner surface, and into said mold to be absorbed thereby, whereby a cast tubular greenbody is formed of settled powder particles;
   centrifugally slip casting at least one additional settled powder layer after casting said slip having suspended powder particles with large dimensional aspect ratios;
   stopping rotation of said mold; and
   removing said greenbody from said mold.

* * * * *